US011333971B2

(12) United States Patent
Nakagawa

(10) Patent No.: US 11,333,971 B2
(45) Date of Patent: May 17, 2022

(54) IMPRINT APPARATUS, IMPRINT METHOD, AND METHOD OF MANUFACTURING ARTICLE

(71) Applicant: CANON KABUSHIKI KAISHA, Tokyo (JP)

(72) Inventor: Kazuki Nakagawa, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 188 days.

(21) Appl. No.: 16/408,586

(22) Filed: May 10, 2019

(65) Prior Publication Data

US 2019/0265589 A1 Aug. 29, 2019

Related U.S. Application Data

(63) Continuation of application No. PCT/JP2017/036246, filed on Oct. 5, 2017.

(30) Foreign Application Priority Data

Nov. 18, 2016 (JP) .............................. JP2016-225375

(51) Int. Cl.
*G03F 7/00* (2006.01)
*H01L 21/027* (2006.01)
(Continued)

(52) U.S. Cl.
CPC .............. *G03F 7/0002* (2013.01); *B05C 9/08* (2013.01); *B29C 59/02* (2013.01);
(Continued)

(58) Field of Classification Search
CPC .................................................... G03F 7/0002
See application file for complete search history.

(56) References Cited

U.S. PATENT DOCUMENTS 8,226,392 B2 7/2012 Kawakami
8,828,307 B2 9/2014 Okushima et al.
(Continued)

FOREIGN PATENT DOCUMENTS

JP 2007098779 A 4/2007
JP 2008260273 A 10/2008
(Continued)

OTHER PUBLICATIONS https://www.pfeiffer-vacuum.com/en/know-how/introduction-to-vacuum-technology/fundamentals/mean-free-path/ (Year: 2016).*
(Continued)

*Primary Examiner* — Binu Thomas
(74) *Attorney, Agent, or Firm* — Rossi, Kimms & McDowell LLP

(57) ABSTRACT

There is provided that an imprint apparatus that forms a pattern on a substrate by curing an imprint material in a state in which a mold and the imprint material on the substrate are in contact with each other, the apparatus including a control unit configured to control a movement of a stage configured to hold the substrate and the supplying of a gas by a gas supplying unit, wherein the control unit removes charges from the mold by starting the supplying of the gas by the gas supplying unit before starting to move the stage below a dispenser after the mold and the cured imprint material are separated, and making a peripheral member face the mold via the gas during the movement of the stage.

15 Claims, 7 Drawing Sheets

(51) Int. Cl.
*B29C 59/02* (2006.01)
*B05C 9/08* (2006.01)
*G03F 7/20* (2006.01)

(52) U.S. Cl.
CPC ........ *G03F 7/70825* (2013.01); *H01L 21/027* (2013.01); *H01L 21/0271* (2013.01); *G03F 7/70716* (2013.01)

(56) References Cited

U.S. PATENT DOCUMENTS

| | | | |
|---|---|---|---|
| 10,067,420 B2 | 9/2018 | Arai et al. | |
| 2009/0295006 A1* | 12/2009 | Kawakami | G03F 7/0002 264/40.1 |
| 2015/0042012 A1* | 2/2015 | Nakagawa | G03F 7/0002 264/293 |
| 2017/0246792 A1* | 8/2017 | Yonekawa | G03F 7/0002 |
| 2017/0248843 A1* | 8/2017 | Seki | G03F 7/0002 |
| 2017/0285463 A1* | 10/2017 | Ito | G03F 7/0002 |
| 2017/0285467 A1* | 10/2017 | Nakayama | G03F 7/0002 |
| 2018/0356741 A1* | 12/2018 | Matsuoka | G03F 7/0002 |

FOREIGN PATENT DOCUMENTS

| | | |
|---|---|---|
| JP | 5235506 B2 | 7/2013 |
| JP | 2014183069 A | 9/2014 |
| JP | 2015115413 A | 6/2015 |
| JP | 2016031952 A | 3/2016 |
| JP | 2016208006 A * | 12/2016 |

OTHER PUBLICATIONS https://glossary.ametsoc.org/wiki/Electron_avalanche (2012).*
https://www.chemeurope.com/en/encyclopedia/Electron_avalanche.html (2021).*
International Search Report issued in Intl. Appln. No. PCT/JP2017/036246 dated Dec. 12, 2017. English translation provided.
Written Opinion issued in Intl. Appln. No. PCT/JP2017/036246 dated Dec. 12, 2017.

* cited by examiner

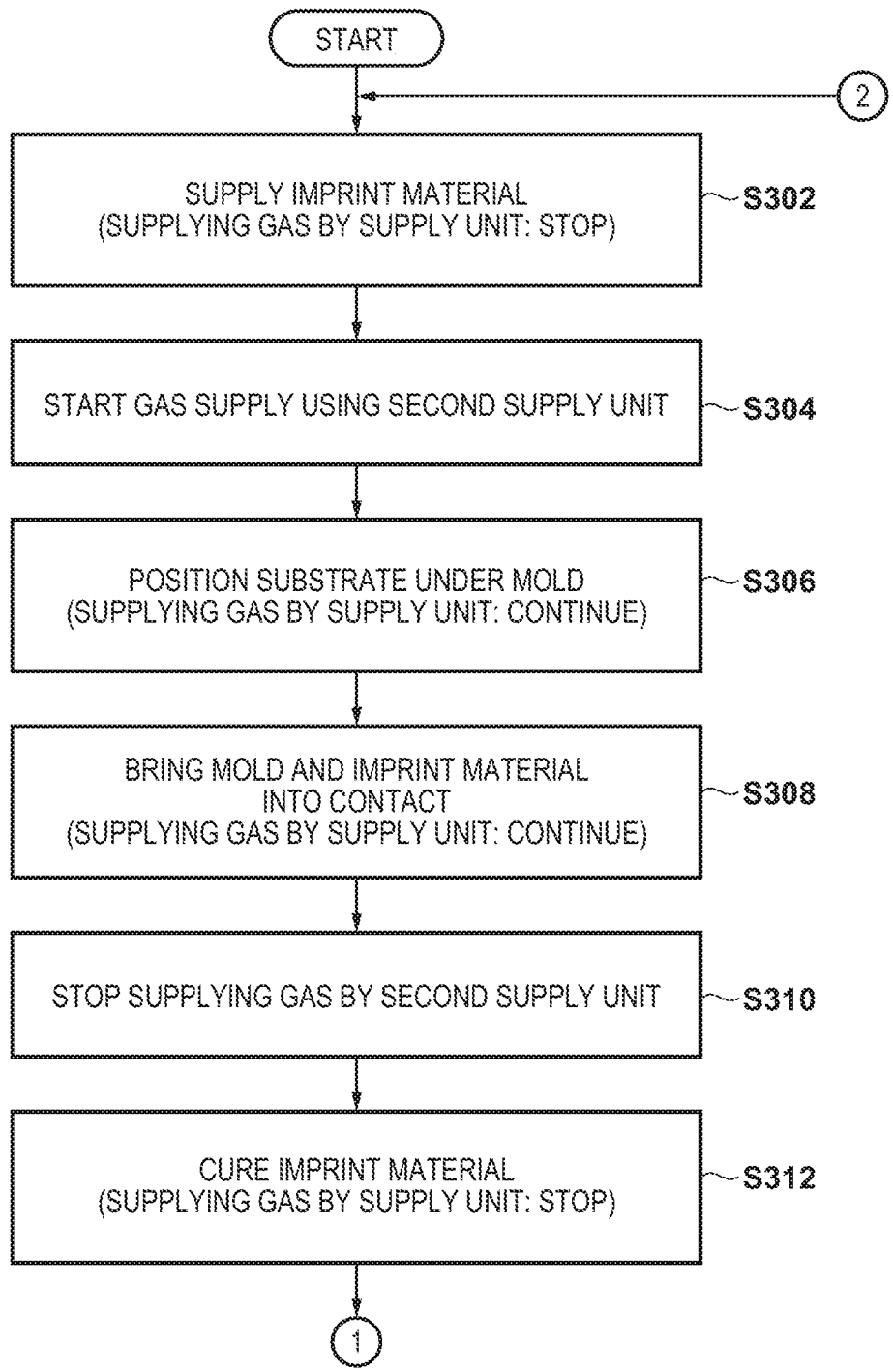

IMPRINT APPARATUS, IMPRINT METHOD, AND METHOD OF MANUFACTURING ARTICLE

CROSS-REFERENCE TO RELATED APPLICATIONS

This application is a Continuation of International Patent Application No. PCT/JP2017/036246, filed Oct. 5, 2017, which claims the benefit of Japanese Patent Application No. 2016-225375, filed Nov. 18, 2016, both of which are hereby incorporated by reference herein in their entirety.

BACKGROUND OF THE INVENTION

Field of the Invention

The present invention relates to an imprint apparatus, an imprint method, and a method of manufacturing an article.

Background Art

Along with increasing demands for further miniaturization of semiconductor devices and MEMS, an imprint process that can form a very fine pattern (structure) of an order of nanometers on a substrate has gained attention together with a photolithography technique of related arts. An imprint technique is a microfabrication technique of forming, on a substrate, an imprint material pattern corresponding to a very fine concave-convex pattern formed on a mold by supplying (applying) an uncured imprint material on the substrate and bringing the imprint material and the mold into contact with each other.

In the imprint technique, a photocuring method is used as a method for curing an imprint material. The photocuring method is a method that forms a pattern of an imprint material on a substrate by curing the imprint material by irradiating the imprint material with light in a state in which the imprint material supplied to a shot region on the substrate is in contact with a mold, and separating the cured imprint material from the mold.

In an imprint apparatus that employs the imprint technique, a phenomenon called a separation charge in which the mold becomes charged by the separation of the imprint material can occur. When such a separation charge occurs, a foreign substance (particle) around the mold will be attracted to the mold and will adhere to the mold. If the imprint material on the substrate and the mold are brought into contact with each other in a state in which a foreign substance has adhered to the mold, it may generate a defect on the pattern to be formed on the substrate or damage the mold in some cases. Hence, there are proposed techniques for removing charges from the mold by supplying an ionized gas to a space between the mold and the substrate (the imprint material on the substrate) (see PTL 1 and PTL 2).

CITATION LIST

Patent Literature

PTL 1: Japanese Patent Laid-Open No. 2007-98779
PTL 2: Japanese Patent No. 5235506

However, in the related arts, the ion concentration of the gas decreases while the ionized gas is supplied to a space between the mold and the substrate. The reduction in ion concentration becomes pronounced particularly when the sectional area of the space where the gas passes is small and the gas passage route is long. It is difficult to effectively remove charges from the mold if a sufficient concentration of ions cannot be maintained until the ionized gas reaches the charge removal target mold.

The present invention provides an imprint apparatus advantageous in removing charges from the mold.

SUMMARY OF THE INVENTION

An imprint apparatus as one aspect of the present invention is an imprint apparatus that forms a pattern on a substrate by curing an imprint material in a state in which a mold and the imprint material on the substrate are in contact with each other, characterized by comprising: a stage configured to hold and move the substrate; a peripheral member arranged in the periphery of a portion where the substrate is to be held on the stage and includes a conductive surface on the side of the mold; a gas supplying unit configured to supply a gas to a space between the mold and the substrate; a dispenser configured to supply the imprint material to the substrate; and a control unit configured to control the movement of the stage and the supplying of the gas by the gas supplying unit, wherein the gas supplying unit and the dispenser are arranged to sandwich a holding unit configured to hold the mold, and the control unit removes charges from the mold by starting the supplying of the gas by the gas supplying unit before starting to move the stage below the dispenser after the mold and the cured imprint material are separated, and making the peripheral member face the mold via the gas during the movement of the stage.

Further features of the present invention will become apparent from the following description of exemplary embodiments with reference to the attached drawings.

BRIEF DESCRIPTION OF THE DRAWINGS

FIG. 3A is a flowchart for explaining an imprint process performed in the imprint apparatus shown in FIG. 1.

DESCRIPTION OF THE EMBODIMENTS

Figure 1:
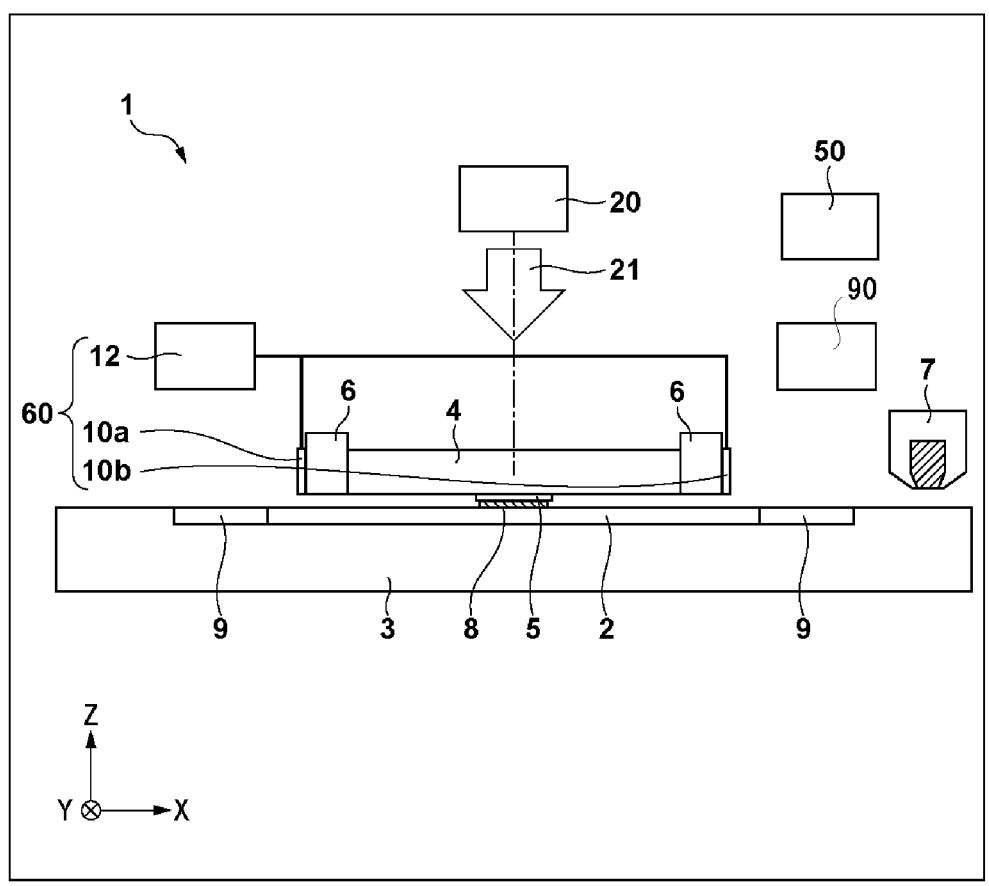
FIG. 1 is a schematic view showing the arrangement of an imprint apparatus as one aspect of the present invention.

FIG. 1 is a schematic view showing the arrangement of an imprint apparatus 1 as one aspect of the present invention. The imprint apparatus 1 is a lithography apparatus that is used for manufacturing a semiconductor device or the like as an article and forms an imprint material pattern on a substrate by using a mold. In this embodiment, the imprint apparatus 1 brings a mold and an imprint material supplied on a substrate into contact with each other and applies a curing energy on the imprint material to form a pattern of a cured product onto which the concave-convex pattern of a mold has been transferred.

As an imprint material, a curable composition (to be also referred to a resin in an uncured state) to be cured by receiving the curing energy is used. Examples of the curing energy are an electromagnetic wave, heat, and the like. The electromagnetic wave is, for example, light selected from the wavelength range of 10 nm (inclusive) to 1 mm (inclusive). Examples of the electromagnetic wave can be infrared light, a visible light beam, and ultraviolet light.

The curable composition can be a composition cured with light irradiation or heating. Among these compositions, the photo-curable composition cured by light irradiation contains at least a polymerizable composition and a photopolymerization initiator, and may further contain a nonpolymerizable compound or a solvent, as needed. The nonpolymerizable compound is at least one material selected from the group consisting of a sensitizer, a hydrogen donor, an internal mold release agent, a surfactant, an antioxidant, and a polymer component.

The imprint material can be supplied on the substrate in the form of a film by a spin coater or a slit coater. The imprint material also may be applied on the substrate in the form of droplets or in the form of an island or film obtained by connecting a plurality of droplets supplied by a liquid injection head. The viscosity (the viscosity at 25° C.) of the imprint material is, for example, 1 mPa·s (inclusive) to 100 mPa·s (inclusive).

The imprint apparatus 1 employs the photo-curing method as the imprint material curing method. The imprint apparatus 1 includes an irradiation unit 20, a mold holding unit 6, a substrate stage 3, a dispenser 7, and a control unit 50. Assume here that a direction parallel to the optical axis of the irradiation unit 20 which irradiates an imprint material 8 on the substrate with ultraviolet light 21 is the Z-axis and that directions orthogonal to each other in a plane perpendicular to the Z-axis are the X-axis and the Y-axis.

When the imprint material 8 on the substrate is to be cured, the irradiation unit 20 irradiates the imprint material 8 on the substrate with the ultraviolet light 21 via a mold 4. The irradiation unit 20 includes, for example, a light source (not shown) and an optical system that adjusts the ultraviolet light 21 emitted from the light source into light suitable for curing the imprint material 8.

The mold 4 has a rectangular outer peripheral shape and includes, on a surface opposing a substrate 2, a pattern portion 5 on which a concave-convex pattern (for example, a circuit pattern) to be transferred to the substrate 2 is formed three-dimensionally. The mold 4 is made of a material that can transmit the ultraviolet light 21 such as, for example, quartz.

The mold holding unit 6 holds and moves the mold 4. The mold holding unit 6 holds the mold 4 by chucking the peripheral region of a surface to be irradiated with the ultraviolet light 21 of the mold 4 by a vacuum suction force or an electrostatic force. The mold holding unit 6 moves the mold 4 in each axis direction so that an operation (imprint operation) to bring the mold 4 and the imprint material 8 on the substrate into contact with each other and an operation (mold separation operation) to separate the mold 4 from the imprint material 8 can be performed selectively. The mold holding unit 6 may include a plurality of driving systems such as a coarse driving system and a fine driving system to implement the positioning of the mold 4 with high accuracy. The mold holding unit 6 may also have a function to move the mold 4 in not only the Z-axis direction but also in the X-axis direction, the Y-axis direction, and the θ directions of the respective axes and a function to correct the tilt of the mold 4.

Although the imprint operation and the mold separation operation in the imprint apparatus 1 may be implemented by moving the mold 4 in the Z-axis direction as in this embodiment, they may be implemented by moving the substrate 2 (the substrate stage 3) in the Z-axis direction. The imprint operation and the mold separation operation also may be implemented by moving both the mold 4 and the substrate 2 relatively in the Z-axis direction.

A glass, a ceramic, a metal, a semiconductor, a resin, or the like is used as the substrate 2, and a member made of a material different from the substrate may be formed on the surface of the substrate, as needed. More specifically, a silicon wafer, a compound semiconductor wafer, or silica glass can be used as the substrate 2. The imprint material 8 to be formed by the pattern portion 5 of the mold 4 is supplied to the substrate 2.

The substrate stage 3 holds and moves the substrate 2. The substrate stage 3 is used to position the mold 4 and the substrate 2 when the mold 4 and the imprint material 8 on the substrate are to be brought into contact with each other. The substrate stage 3 moves the substrate 2 in each axis direction. The substrate stage 3 may include a plurality of driving systems such as a coarse driving system and a fine driving system with respect to each direction in the X-axis and the Y-axis. The substrate stage 3 also may have a function to move the substrate 2 in the Z-axis direction and the θ directions of the respective axes and a function to correct the tilt of the substrate 2.

The dispenser 7 is arranged in the vicinity of the mold holding unit 6 and supplies (discharges) the imprint material 8 to the substrate 2. In this embodiment, the imprint material 8 has a property in which it is cured by irradiation with the ultraviolet light 21, but the type of the imprint material is suitably selected in accordance with various kinds of conditions such as the manufacturing process of the semiconductor device. In addition, the amount of the imprint material 8 to be discharged from the dispenser 7 is suitably determined in accordance with the thickness (remaining film thickness) of the imprint material 8 to be formed on the substrate, the density of the pattern to be formed on the substrate, and the like.

The control unit 50 includes a CPU, a memory, and the like and controls each unit of the imprint apparatus 1 to operate the imprint apparatus 1. More specifically, first, the control unit causes the imprint material 8 to be supplied to the substrate 2 and positions the mold 4 and the substrate 2 in a predetermined positional relationship. The control unit then moves the mold 4 in the −Z direction to bring the mold 4 (the pattern portion 5) and the imprint material 8 on the substrate into contact with each other. The control unit causes a pattern of the imprint material 8 to be formed on the substrate by causing the imprint material 8 to be cured in a state in which the mold 4 and the imprint material 8 are in contact with each other and separating the mold 4 from the cured imprint material 8 on the substrate by moving the mold 4 in the +Z direction.

If the mold 4 and the imprint material 8 on the substrate are brought into contact with each other here in a state in which a foreign substance such as a particle has adhered to the mold 4 (the pattern portion 5), it may generate a defect in the pattern to be formed on the substrate or may damage the mold 4. Although the imprint apparatus 1 is arranged in a clean environment for manufacturing semiconductor devices, it is very difficult to completely eliminate the generation of a foreign substance. A foreign substance can be generated from each of the units themselves that form the imprint apparatus 1, can be generated from the sliding operations of the respective units forming the imprint apparatus 1, or can be generated when the imprint apparatus 1 is brought in from the outside.

In addition, in the imprint apparatus 1, a phenomenon called a separation charge in which the mold 4 (the pattern portion 5) becomes charged by separating the mold 4 from the cured imprint material 8 on the substrate can occur in general. When such a separation charge occurs, foreign substances around the mold 4 are attracted to the mold 4, and this increases the probability that a foreign substance will adhere to the mold 4. Although it will vary depending on the dimension of the pattern and the depth of the pattern of the pattern portion 5 of the mold 4, the possibility of a defect on the pattern to be formed on the substrate or a damage to mold 4 increases when a foreign substance of a size equal to or more than a half pitch of the pattern adheres to the mold 4.

In order to cope with such a separation charge, charges need to be removed from the mold 4 in the imprint apparatus 1. In a related art, for example, an ionizer is used to remove charges from the mold 4. There are various kinds of ionizers such as an ionizer which employs a corona discharge method, an ionizer which employs an energy beam irradiation method (for example, an X-ray irradiation method or an α-ray irradiation method), and the like. In general, the corona discharge method may cause particle generation. Hence, it is preferable to employ the X-ray irradiation method or the α-ray irradiation method to remove charges from the mold 4 while maintaining cleanliness. Since the space between the mold 4 and the substrate 2 is a very narrow space, it is difficult to directly irradiate the mold 4 with an X-ray beam or an α-ray beam by arranging an ionizer around the space. Other than the method in which the mold 4 is directly irradiated with an X-ray beam or an α-ray beam, there is a method of ionizing a gas by irradiating the gas with an X-ray beam or an α-ray beam and supplying the ionized gas to the space below the mold 4. However, since the ion concentration of the ionized gas decreases while the gas passes the path from a pipe or a nozzle to the space between the mold 4 and the substrate 2, there may be a case in which a sufficient concentration of ions cannot be maintained in the space below the mold 4. Charges cannot be removed efficiently from the mold 4 in such a case.

Figure 2:
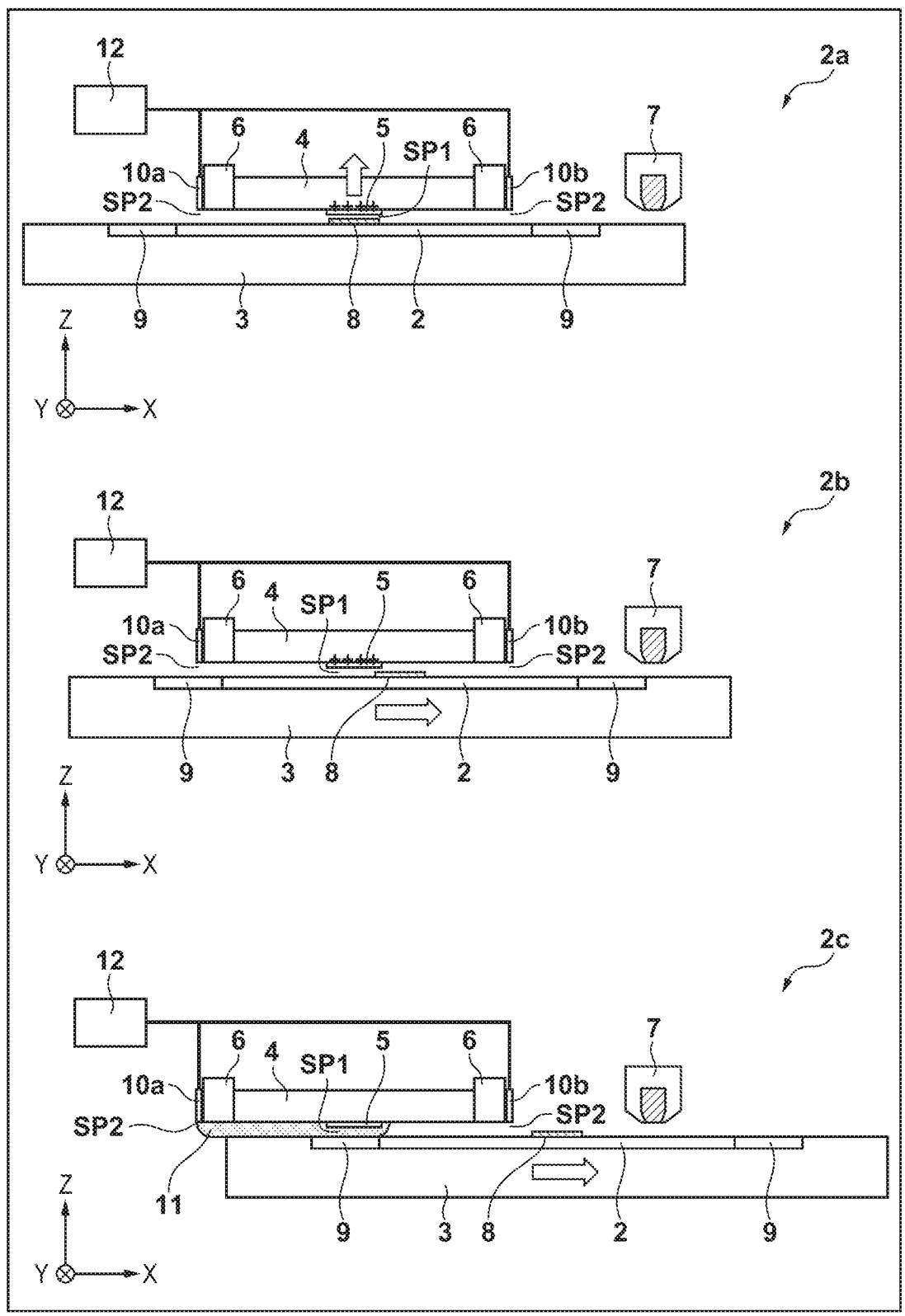
FIG. 2 is a view for explaining the principle of mold charge removal performed in the imprint apparatus shown in FIG. 1.

Therefore, in this embodiment, in order to efficiently remove charges from the mold 4, the imprint apparatus 1 further includes an auxiliary plate 9 arranged on the substrate stage 3 so as to surround the periphery of the substrate 2 and a supply unit 60 that supplies a gas 11 for removing charges from the mold 4. Note that, however, the auxiliary plate 9 need not be arranged to surround the periphery of the substrate 2, and is a peripheral member arranged in the periphery of a portion which holds the substrate 2 on the substrate stage. In addition, the auxiliary plate 9 is arranged so that the height of the front surface of the auxiliary plate 9 and the height of the front surface of the substrate 2 will be approximately the same (so that the difference will be equal to or less than 1 mm). The supply unit 60 includes a gas supply source 12, a first supply unit 10a, and a second supply unit 10b. As shown in FIGS. 2a to 2c, the first supply unit 10a and the second supply unit 10b supply the gas 11 from the gas supply source 12 to a second space SP2 adjacent to a first space SP1 below the mold 4. The first space SP1 below the mold 4 here is, for example, a space defined between the mold 4 and the substrate 2 when the mold 4 and the substrate 2 face each other, and is a space defined between the mold 4 and the auxiliary plate 9 when the mold 4 and the auxiliary plate 9 face each other. The first supply unit 10a and the dispenser 7 are arranged to sandwich the mold holding unit 6. Note that the first supply unit 10a, the dispenser 7, and the mold holding unit 6 need not be arranged on a single line. As long as the first supply unit 10a, the mold holding unit 6, and the dispenser 7 are arranged in this order at least with respect to a position in a predetermined direction (the X-axis direction in this embodiment), the arrangements in the positions in the Y-axis direction may be shifted more or less from each other. The second supply unit 10b is also arranged between the dispenser 7 and the mold holding unit 6, and the first supply unit 10a and the second supply unit 10b are arranged to sandwich the mold holding unit 6.

The charge removal principle of the mold 4 according to this embodiment will be described with reference to FIGS. 2a and 2b. As shown in FIG. 2a, the mold 4 (the pattern portion 5) becomes charged (separation charge) when the mold 4 is separated from the cured imprint material 8 on the first region (shot region) of the substrate 2. Although FIG. 2a shows a case in which the mold 4 is charged on the positive side, the mold 4 may become charged on the negative side depending on the materials and the shapes of the substrate 2 and the imprint material 8, the condition when the mold 4 is separated from the cured imprint material 8 on the substrate, and the like.

As shown in FIG. 2b, after a pattern of the cured imprint material 8 has been formed on the first region of the substrate 2, the substrate stage 3 needs to be moved below the dispenser 7 to supply the imprint material 8 to the second region (shot region) of the substrate 2. In this embodiment, the first supply unit 10a will start to supply the gas 11 before the operation to move the substrate stage 3 below the dispenser 7 is started. As a result, the gas 11 supplied from the first supply unit 10a to the second space SP2 is drawn to the first space SP1 below the mold 4 by a Couette flow that occurs on the surfaces of the substrate 2 and the substrate stage 3 due to the movement of the substrate stage 3.

As shown in FIG. 2c, when the substrate stage 3 is moved to make the mold 4 (the pattern portion 5) and the auxiliary plate 9 face each other, the charges are removed from the mold 4 via the gas 11 since the space between the mold 4 and the auxiliary plate 9 is filled with the gas 11 that was drawn into the first space SP1.

The gas 11 for charge removal needs to contain a gas having a longer mean free path for an electron than air. More specifically, the gas 11 may be a rare gas constituted by monatomic molecules. Helium, which has the longest mean free path among rare gases, is particularly preferable. Electrons present in an electric field are carried to the anode side by the electric field and collide with gas molecules in the process of being carried. In this case, when the electrons, which have sufficiently been accelerated to have energy higher than the ionization energy of the gas, collide with gas molecules, ionization occurs, and electron-cation pairs are generated. The generated electrons are also accelerated by the electric field to ionize gas molecules. This phenomenon in which a large amount of electron-cation pairs are generated in this manner by the sequential occurrence of ionization is called an electron avalanche. In a gas having a long mean free path for electrons, electrons in the process of being accelerated do not collide with gas molecules and are accelerated to a high energy state. Hence, a gas having a long mean free path for electrons causes an electron avalanche more easily than air even in a low electric field. This makes it possible to remove charges from the mold 4 before a large amount of voltage is accumulated.

In addition, the auxiliary plate 9 which faces the mold 4 has conductivity on its surface on the side of the mold 4. The auxiliary plate 9 is made of a metal in this embodiment. As a result, since ions that have been ionized in the gas will discharge secondary electrons when the ions are accelerated by the electric field and collide with (the surface on the side of the mold 4 of) the auxiliary plate 9 and the secondary electrons will further contribute to the electron avalanche, the efficiency of the removal of charges from the mold 4 can be improved.

Figure 3B:
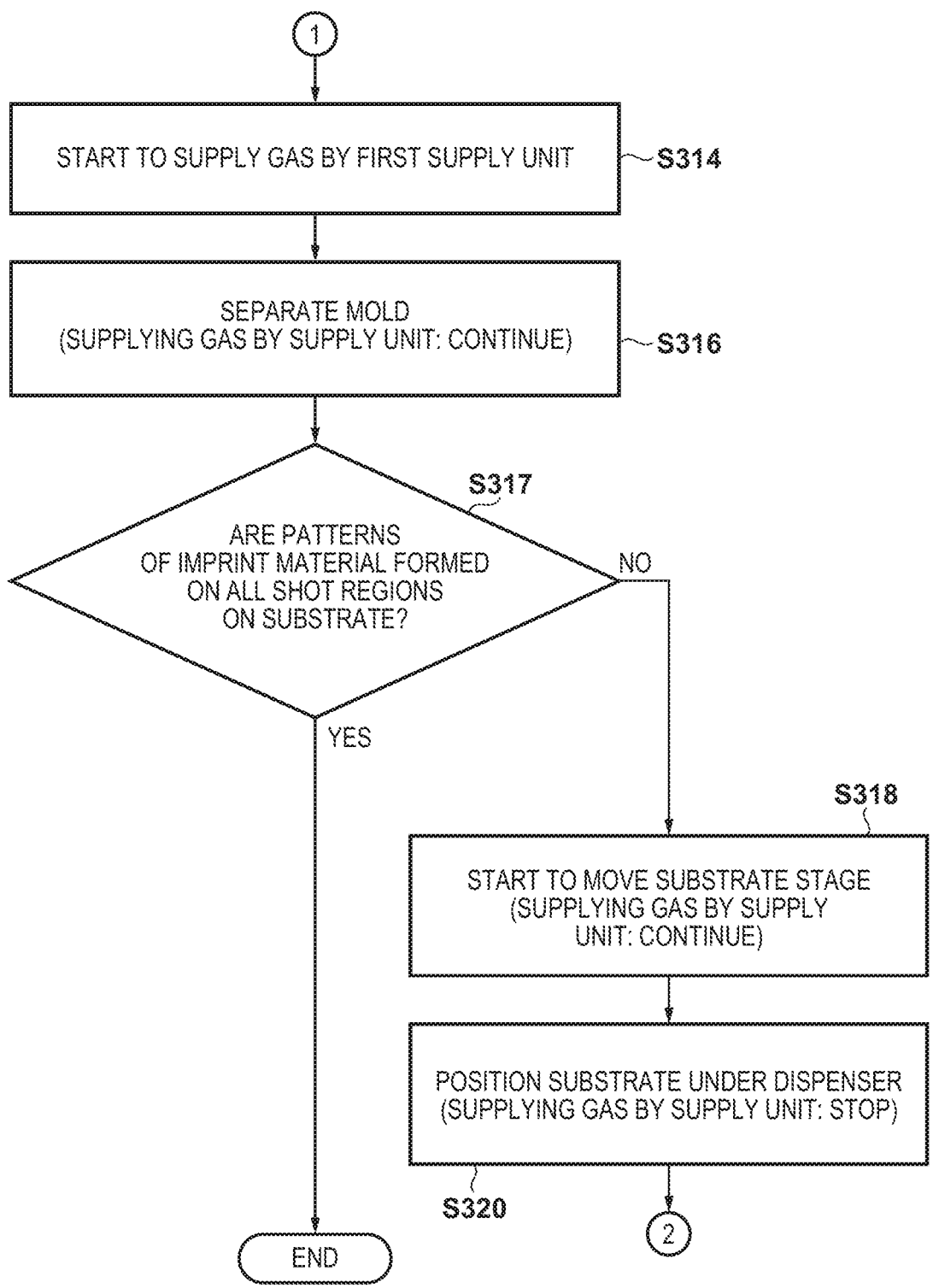
FIG. 3B is a flowchart for explaining the imprint process performed in the imprint apparatus shown in FIG. 1.

The imprint process performed in the imprint apparatus 1, particularly, the removal of charges from the mold 4 will be described in detail with reference to FIGS. 3A and 3B. The imprint process is performed by the control unit 50 by generally controlling the units of the imprint apparatus 1. A case in which the pattern of the imprint material 8 is formed sequentially on the first region and the second region as shot regions of the substrate 2 will be exemplified here.

In step S302, the substrate stage 3 which holds the substrate 2 is moved to position the first region of the substrate 2 under the dispenser 7, and the dispenser 7 supplies the imprint material 8 onto the first region of the substrate 2. At this time, the supplying of the gas 11 by the supply unit 60 (the first supply unit 10a and the second supply unit 10b) is stopped.

In step S304, before the operation to move the substrate stage 3 below the mold 4 is started, the supply unit 60, more specifically, the second supply unit 10b will start to supply the gas 11. Note that although the gas 11 is supplied only from the second supply unit 10b to suppress the use amount of the gas 11 in this embodiment, the gas 11 may be supplied by also the first supply unit 10a in addition to the second supply unit 10b if the use amount of the gas 11 need not be suppressed.

In step S306, the substrate stage 3 is moved to position the first region of the substrate 2 below the mold 4. At this time, the second supply unit 10b continues to supply the gas 11. As a result, the gas 11 supplied from the second supply unit 10b to the second space SP2 is drawn to the first space SP1 below the mold 4, and the space between the mold 4 and the substrate 2 (the imprint material 8 of the first region of the substrate 2) can be filled with the gas 11.

In step S308, the mold 4 and the imprint material 8 on the first region of the substrate 2 are brought into contact with each other. While the pattern portion 5 of the mold 4 is filled with the imprint material 8 by bringing the mold 4 and the imprint material 8 to be in contact with each other, the second supply unit 10b continues to supply the gas 11 so that the concentration of the gas 11 will be equal to or more than 99% in the first space SP1 below the mold 4. This can promote the filling of the imprint material 8 to the pattern portion 5 of the mold 4.

In step S310, the second supply unit 10b stops supplying the gas 11 before the imprint material 8 on the first region of the substrate 2 is cured in the state in which the mold 4 and the imprint material 8 are in contact with each other. Here, the concentration of the gas 11 is set to be less than 99%, more specifically, equal to or less than 90% in the first space SP1 below the mold 4. That is, it is set so that the ratio of oxygen around the mold 4 will increase more than that in the process of step S308. A portion of the imprint material 8 can partially overflow from the pattern portion 5 of the mold 4 and adhere to the side surface (edge) of the pattern portion 5 in some cases when the mold 4 and the imprint material 8 are brought into contact with each other. If the imprint material 8 that adhered to the side surface of the pattern portion 5 is cured, the cured imprint material 8 will peel off and become a particle. Hence, it is preferable not to cure the imprint material 8 that adhered to the side surface of the pattern portion 5, that is, it is preferable to maintain the imprint material adhered to the side surface in an uncured state. Therefore, in this embodiment, the concentration of the gas 11 in the first space SP1 below the mold 4 is increased to use oxygen to inhibit the reaction to the curing of the imprint material 8 by the ultraviolet light 21. Note that since only a very small amount of the uncured imprint material 8 will adhere to the side surface of the pattern portion 5, it will evaporate until the time the imprint material 8 supplied to the second region is to be cured. Hence, there is no influence on the pattern formation in the second region.

In step S312, the imprint material 8 is cured by irradiating the imprint material 8 with the ultraviolet light 21 from the irradiation unit 20 in a state in which the mold 4 and the imprint material 8 on the first region of the substrate 2 are in contact with each other. At this time, the supplying of the gas 11 by the supply unit 60 (the second supply unit 10b) is kept stopped.

In step S314, before the mold 4 is separated from the cured imprint material 8 on the first region of the substrate 2, the supply unit 60, more specifically, the first supply unit 10a starts supplying the gas 11. Note that although the gas 11 is supplied from only the first supply unit 10a to suppress the use amount of the gas 11 in this embodiment, the gas 11 may also be supplied from the second supply unit 10b in addition to the first supply unit 10a if the use amount of the gas 11 need not be suppressed.

In step S316, the mold 4 is separated from the cured imprint material 8 on the first region of the substrate 2. As a result, a pattern of the imprint material 8 is formed on the first region of the substrate 2. On the other hand, the mold 4 (the pattern portion 5) is charged by the separating of the mold 4 from the cured imprint material 8 on the first region of the substrate 2. At this time, the supplying of the gas 11 by the first supply unit 10a is continued.

In step S317, whether the pattern of the imprint material 8 has been formed on all of the shot regions of the substrate 2 is determined. If the pattern of the imprint material 8 has been formed on all of the shot regions of the substrate 2, the supplying of the gas 11 by the first supply unit 10a is stopped and the operation ends. If the pattern of the imprint material 8 has not been formed on all of the shot regions of the substrate 2, the process advances to step S318.

In step S318, the operation to move the substrate stage 3 below the dispenser 7 is started to supply the imprint material 8 to the second region which is a region different from the first region of the substrate 2. At this time, the first supply unit 10a continues to supply the gas 11. In other words, the first supply unit 10a continues to supply the gas 11 while the substrate stage 3 is moved below the dispenser 7. Since the first supply unit 10a starts to supply the gas 11 before the start of the operation to move the substrate stage 3 to a position below the dispenser 7, the gas 11 supplied from the first supply unit 10a to the second space SP2 is drawn to the first space SP1 below the mold 4. Hence, the first space SP1 below the mold 4 is filled with the gas 11, and electron-cation pairs are generated by an electron avalanche caused when the auxiliary plate 9 and the mold 4 have faced each other by the movement of the substrate stage 3. Accordingly, the charges are removed from the mold 4 as the electron-cation pairs get closer to the mold 4. In this manner, the charges are removed from the mold 4 via the gas 11 supplied to the first space SP1 below the mold 4. In addition, the supplying of the gas 11 by the first supply unit 10a is controlled so that the concentration of the gas 11 will be equal to or more than 99% in the space between the mold 4 and the auxiliary plate 9 at the time of the removal of charges from the mold 4. Note that this embodiment assumes that the removal of charges from the mold 4 will be completed while the substrate stage 3 is being moved below the dispenser 7. However, if the removal of charges from the mold 4 has not been completed, the substrate stage 3 may be stopped in a state in which the auxiliary plate 9 and the mold 4 face each other or the speed of the substrate stage 3 in a state in which the auxiliary plate 9 and the mold 4 face each other may be slowed down.

In step S320, the second region of the substrate 2 is positioned below the dispenser. At this time, the first supply unit 10a stops supplying the gas 11. In other words, the first supply unit 10a stops supplying the gas 11 when the substrate stage 3 reaches a position below the dispenser 7. The process subsequently advances to step S302, the imprint material 8 is supplied onto the second region of the substrate 2, and the process for forming a pattern of the imprint material 8 on the second region of the substrate 2 is continued.

In this manner, after the mold 4 is separated from the cured imprint material 8 on the first region of the substrate 2, the first supply unit 10a starts to supply the gas 11 before the start of the operation to move the substrate stage 3 below the dispenser 7 to supply the imprint material 8 to the second region of the substrate 2. The gas 11 supplied to the second space SP2 is supplied to the first space SP1 by moving the substrate stage 3 below the dispenser 7, and charges are removed from the mold 4 via the gas 11 by setting the auxiliary plate 9 to face the mold 4. Therefore, since charges can be efficiently removed from the mold 4 in the imprint apparatus 1 according to this embodiment, it is possible to suppress the adherence of foreign substances on the mold 4 and reduce damage to the mold 4 and the generation of defects on the pattern to be formed on the substrate.

Note that the gas 11 is supplied from the first supply unit 10a when the mold 4 is to be separated from the cured imprint material 8 on the substrate in this embodiment. However, the present invention is not limited to this. For example, it may be set so that the first supply unit 10a will not start to supply the gas 11 before the mold 4 is separated from the cured imprint material 8 on the substrate, and that the first supply unit 10a will start to supply the gas 11 after the mold 4 has been separated from the cured imprint material 8 on the substrate.

Figure 4:
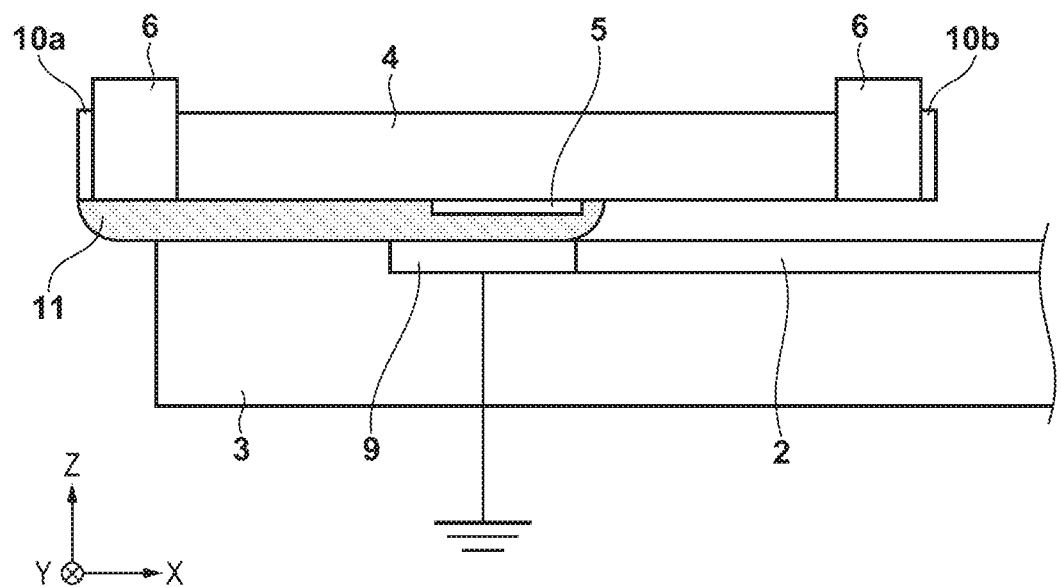
FIG. 4 is a view showing the vicinity of an auxiliary plate of the imprint apparatus shown in FIG. 1.

Also, as shown in FIG. 4, the auxiliary plate 9 may be electrically grounded. This will allow the potential of the mold 4 to be equal to the potential of the auxiliary plate 9 when charges are removed from the mold 4 by the electron avalanche between the mold 4 (the pattern portion 5) and the auxiliary plate 9. Therefore, since the potential of the mold 4 will be equal to the potentials of other members inside the imprint apparatus 1, a strong electric field will not be generated in the periphery of the mold 4, and foreign substance adherence due to an electrostatic force can be suppressed.

Figure 5:
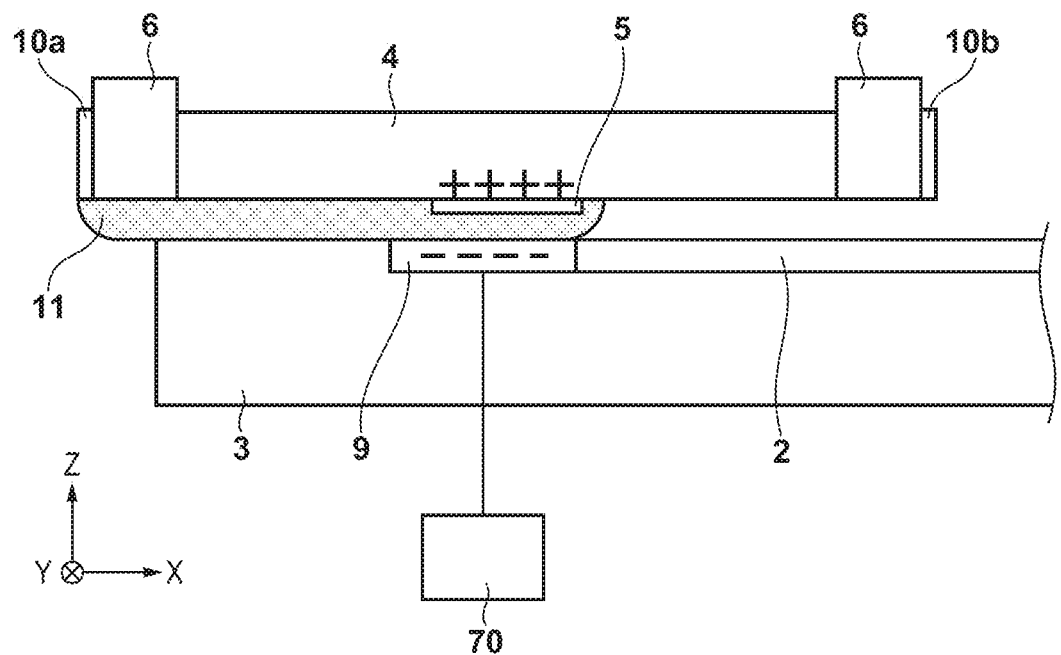
FIG. 5 is a view showing the vicinity of the auxiliary plate of the imprint apparatus shown in FIG. 1.

In addition, as shown in FIG. 5, the imprint apparatus 1 can further include an applying unit 70 for applying a potential to the auxiliary plate 9. When the auxiliary plate 9 is to face the mold 4, the applying unit 70 can apply, to the auxiliary plate 9, a potential having a polarity opposite to the polarity of the potential generated in the mold 4 by separating mold 4 from the cured imprint material 8 on the substrate. This will increase the potential difference between the mold 4 and the auxiliary plate 9 and increase the electric field between the mold 4 and the auxiliary plate 9, and will allow an electron avalanche to occur more easily. Hence, even in a case in which the charge amount of the mold 4 due to the separation charges is small, the charges can be removed from the mold 4 by an electron avalanche. As shown in FIG. 5, in a case in which the mold 4 is charged on the positive side, the applying unit 70 can provide a negative potential to the auxiliary plate 9. On the other hand, in a case in which the mold 4 is charged on the negative side, the applying unit 70 can provide a positive potential to the auxiliary plate 9. The applying unit 70 includes a power supply that can provide potentials of both polarities to the auxiliary plate 9.

Figure 6:
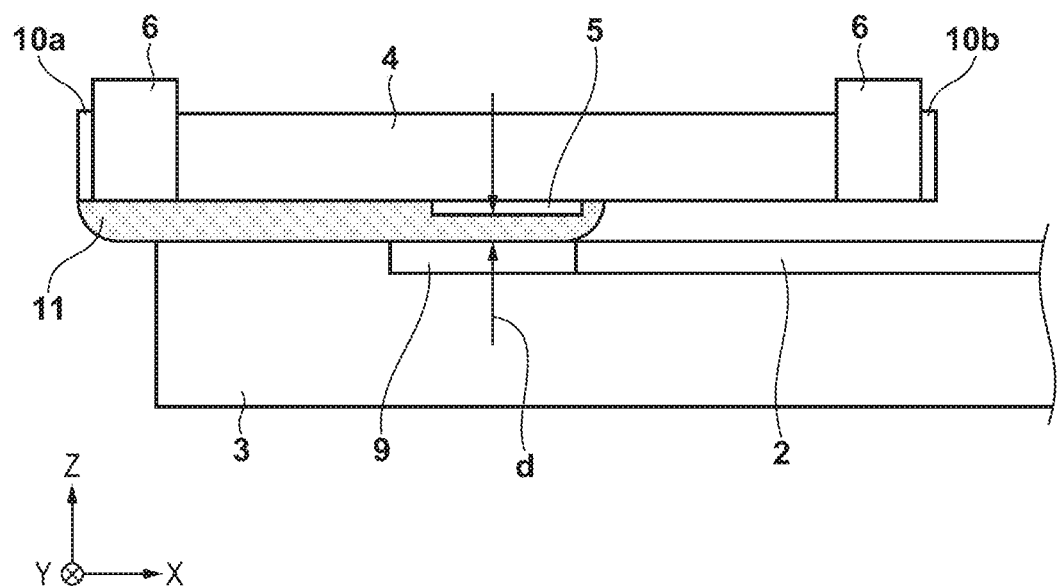
FIG. 6 is a view showing the vicinity of the auxiliary plate of the imprint apparatus shown in FIG. 1.

Also, the electron avalanche which occurs between the mold 4 and the auxiliary plate 9 can be controlled by adjusting not only the type of the gas 11 but also the distance between the mold 4 and the auxiliary plate 9. For example, the strength of the electric field between the mold 4 and the auxiliary plate 9 can be adjusted by adjusting the distance between the mold 4 and the auxiliary plate 9. Thus, as shown in FIG. 6, a distance d between the mold 4 and the auxiliary plate 9 is adjusted when the auxiliary plate 9 is to face the mold 4. The mold holding unit 6 or the substrate stage 3 can be used as a distance adjustment unit for changing the distance d between the mold 4 and the auxiliary plate 9.

The electron avalanche which occurs between the mold 4 and the auxiliary plate 9 can also be controlled by adjusting the pressure in the space between the mold 4 and the auxiliary plate 9. For example, the mean free path of the electrons between the mold 4 and the auxiliary plate 9 can be adjusted by adjusting the pressure in the space between the mold 4 and the auxiliary plate 9. Thus, a pressure changing unit 90 for changing the pressure in the space between the mold 4 and the auxiliary plate 9 is arranged, and the pressure changing unit 90 will adjust the pressure in the space between the mold 4 and the auxiliary plate 9 when the auxiliary plate 9 is to face the mold 4. The pressure changing unit 90 may adjust the pressure in the space between the mold 4 and the auxiliary plate 9, may locally change the pressure in the vicinity including the space, or may change the pressure in the entire space of the imprint apparatus 1.

Figure 7:
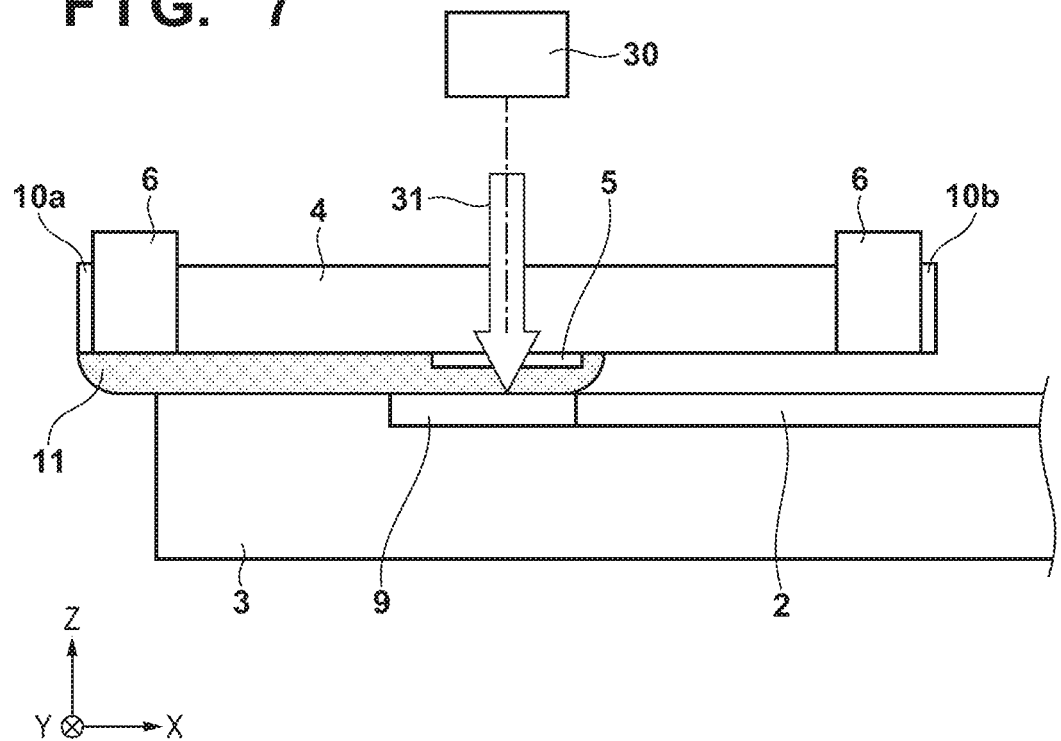
FIG. 7 is a view showing the vicinity of the auxiliary plate of the imprint apparatus shown in FIG. 1.

Also as shown in FIG. 7, the imprint apparatus 1 can further include an energy irradiation unit 30 for irradiating the auxiliary plate 9 with light 31. The energy irradiation unit 30 irradiates the auxiliary plate 9 with the light 31 having energy equal to or more than the work function of the auxiliary plate 9 when the auxiliary plate 9 is to face the mold 4. For example, since the work function of the auxiliary plate 9 is approximately 4 eV in a case in which the auxiliary plate 9 is made of aluminum, photoelectrons will be discharged from (the surface on the side of the mold 4 of) the auxiliary plate 9 by a photoelectric effect when the auxiliary plate is irradiated by the light 31 having a wavelength equal to or less than 300 nm. As the work function of a metal is generally about 2 eV to 5 eV, irradiating the auxiliary plate 9 with the light 31 belonging to the ultraviolet region will cause photoelectrons to be discharged from the auxiliary plate 9 by the photoelectric effect. Since the photoelectrons will contribute to the electron avalanche, the efficiency of the removal of charges from the mold 4 can be further improved.

The gas 11 for charge removal to be used in the imprint apparatus 1 has high diffusibility in general. Accordingly, as described above, the filling property of the imprint material 8 to the pattern portion 5 of the mold 4 can be improved by filling the space between the mold 4 and the substrate 2 with the gas 11 when the mold 4 and the imprint material 8 on the substrate are to be brought into contact with each other. Hence, it is preferable for the gas 11 to be supplied during the process in which the mold 4 and the imprint material 8 on the substrate are brought into contact with each other. However, since the rare gas to be used as the gas 11 is expensive, the supplying of the gas 11 can be stopped during the process in which the imprint material 8 is to be cured when the filling of the pattern portion 5 of the mold 4 with the imprint material 8 has been completed.

The pattern of a cured product formed using the imprint apparatus 1 is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, a SRAM, a flash memory, and a MRAM and semiconductor elements such as an LSI, a CCD, an image sensor, and an FPGA. Examples of the mold are molds for imprint.

The pattern of the cured product is directly used as at least a part of the constituent member of the above-described article or used temporarily as a resist mask. After etching or ion implantation is performed in the substrate processing step, the resist mask is removed.

Figure 8:
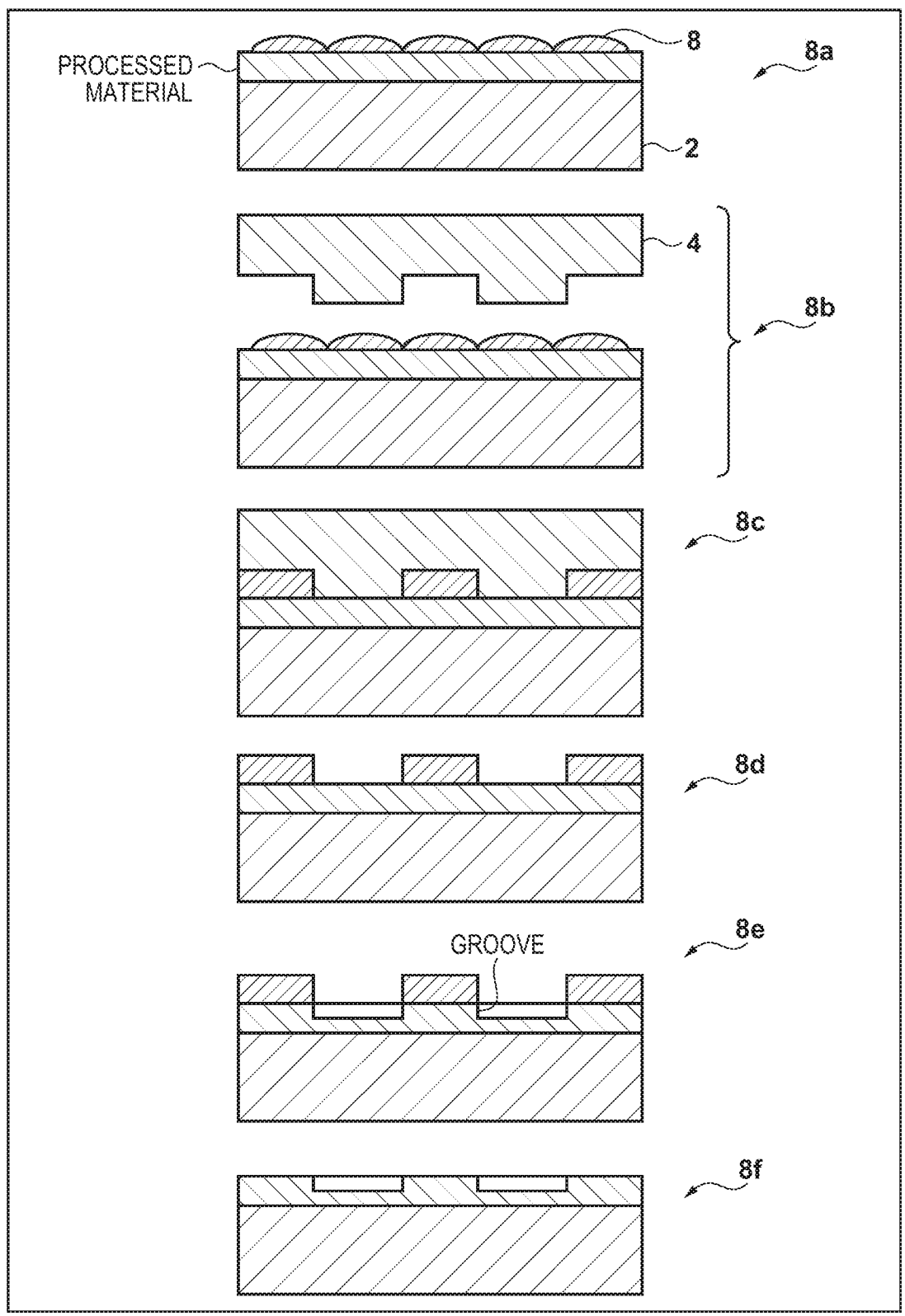
FIG. 8 is a view for explaining a method of manufacturing an article.

A more specific method of manufacturing an article will be described next. As shown in FIG. 8a, the substrate 2 such as a silicon wafer with a processed material such as an insulator formed on the surface is prepared. Next, the imprint material 8 is applied to the surface of the processed material by an inkjet method or the like. A state in which the imprint material 8 is applied as a plurality of droplets onto the substrate is shown here.

As shown in FIG. 8b, a side of the mold 4 for imprint with a convex-concave pattern is directed and made to face the imprint material 8 on the substrate. As shown in FIG. 8c, the substrate 2 to which the imprint material 8 is applied is brought into contact with the mold 4, and a pressure is applied. The gap between the mold 4 and the processed material is filled with the imprint material 8. The imprint material 8 is cured when it is irradiated with energy for curing via the mold 4 in this state.

As shown in FIG. 8d, after the imprint material 8 is cured, the mold 4 is separated from the substrate 2. Then, the pattern of the cured product of the imprint material 8 is formed on the substrate. In the pattern of the cured product, the concave portion of the mold 4 corresponds to the convex portion of the cured product, and the convex portion of the mold 4 corresponds to the concave portion of the cured product. That is, the concave-convex pattern of the mold 4 has been transferred to the imprint material 8.

As shown in FIG. 8e, when etching is performed using the pattern of the cured product as an etching resistant mask, a portion of the surface of the processed material where the cured product does not exist or remains thin is removed to form a groove. As shown in FIG. 8f, when the pattern of the cured product is removed, an article with the grooves formed in the surface of the processed material can be obtained. Here, the pattern of the cured product is removed. However, instead of processing or removing the pattern of the cured product, it may be used as, for example, an interlayer dielectric film included in a semiconductor element or the like, that is, a constituent member of an article.

The present invention is not limited to the above-described embodiments, and various changes and modifications can be made within the spirit and scope of the present invention. Therefore, to apprise the public of the scope of the present invention, the following claims are made.

According to the present invention, for example, an imprint apparatus advantageous in removing charges from a mold can be provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. An imprint apparatus that forms a pattern on a substrate by curing an imprint material in a state in which a mold and the imprint material on the substrate are in contact with each other, the imprint apparatus comprising:
   a stage configured to hold and move the substrate;
   a peripheral member arranged in a periphery of a portion where the substrate is to be held on the stage and including a conductive surface;
   a gas supplying unit configured to supply a gas to a space between the mold and the substrate;
   a dispenser configured to supply the imprint material to the substrate; and
   a control unit configured to control the movement of the stage and the supplying of the gas by the gas supplying unit,
   wherein the gas supplying unit and the dispenser are arranged to sandwich a holding unit configured to hold the mold, and
   the control unit is configured to start the supplying of the gas by the gas supplying unit before starting to move the stage below the dispenser after the mold and a cured imprint material are separated and to cause the peripheral member to face the mold via the gas during the movement of the stage, the peripheral member facing the mold via the gas causing charges to be removed from the mold via the gas by an electron avalanche that occurs when the peripheral member faces the mold via the gas.

2. The imprint apparatus according to claim 1, wherein the control unit is configured to control the supplying of the gas by the gas supplying unit so that a concentration of the gas will be not less than 99% in a space between the peripheral member and the mold when the charges are to be removed from the mold.

3. The imprint apparatus according to claim 1, wherein the control unit is configured to continue the supplying of the gas by the gas supplying unit while the stage is moved below the dispenser.

4. The imprint apparatus according to claim 1, further comprising:
   a second gas supplying unit arranged between the dispenser and the holding unit and configured to supply a gas to a second space adjacent to a first space below the mold,
   wherein the gas supplying unit and the second gas supplying unit are arranged to sandwich the holding unit, and
   the control unit is configured to stop the supplying of the gas by the gas supplying unit after the stage arrives below the dispenser, to start the supplying of the gas by the second gas supplying unit before the movement of the stage below the mold is started after the imprint material is supplied onto the substrate, and to supply the gas supplied to the second space to the first space by causing the stage to move below the mold.

5. The imprint apparatus according to claim 4, wherein the control unit is configured to continue the supplying of the gas by the second gas supply unit while a pattern of the mold is being filled with the imprint material by causing the mold and the imprint material supplied on the substrate to be brought into contact with each other.

6. The imprint apparatus according to claim 5, wherein the control unit is configured to stop the supplying of the gas by the second gas supplying unit before the imprint material is cured in a state in which the mold and the imprint material supplied on the substrate are in contact with each other.

7. The imprint apparatus according to claim 4, wherein the control unit is configured to control the supplying of the gas by the second gas supplying unit so that a concentration of the gas will be less than 99% in the first space when the imprint material is to be cured in a state in which the mold and the imprint material on the second region are in contact with each other.

8. The imprint apparatus according to claim 1, wherein the peripheral member is grounded.

9. The imprint apparatus according to claim 1, further comprising an applying unit configured to provide a potential to the peripheral member,
wherein when the peripheral member is to face the mold, the control unit is configured to cause the applying unit to provide, to the peripheral member, a potential of a polarity opposite to a polarity of a potential generated in the mold by separating the mold and the cured imprint material on the substrate.

10. The imprint apparatus according to claim 1, further comprising:
a distance changing unit configured to change a distance between the mold and the peripheral member,
wherein when the peripheral member is to face the mold, the control unit is configured to cause the distance changing unit to adjust the distance between the mold and the peripheral member.

11. The imprint apparatus according to claim 1, further comprising:
a pressure adjuster configured to change a pressure in a space between the mold and the peripheral member,
wherein when the peripheral member is to face the mold, the control unit is configured to cause the pressure adjuster to change the pressure in the space between the mold and the peripheral member.

12. The imprint apparatus according to claim 1, further comprising:
an irradiation unit configured to irradiate the peripheral member with light,
wherein when the peripheral member is to face the mold, the control unit is configured to cause the irradiation unit to irradiate the peripheral member with light having energy not less than a work function of the peripheral member.

13. The imprint apparatus according to claim 1, wherein the gas contains a gas having a longer mean free path of an electron than a mean free path of air.

14. The imprint apparatus according to claim 1, wherein the gas contains helium.

15. An imprint apparatus that forms a pattern on a substrate by curing an imprint material in a state in which a mold and the imprint material on the substrate are in contact with each other, the imprint apparatus comprising:
a stage configured to hold and move the substrate;
a peripheral member arranged in the periphery of a portion where the substrate is to be held on the stage and including a conductive surface;
a dispenser configured to supply the imprint material to the substrate; and
a control unit configured to control the movement of the stage,
wherein the control unit is configured to cause the peripheral member to face the mold while causing the stage to move to the dispenser, the peripheral member facing the mold causing charges to be removed from the mold by an electron avalanche aided by the conductive surface of the peripheral member.

* * * * *